(12) United States Patent
Suzuki et al.

(10) Patent No.: US 8,399,100 B2
(45) Date of Patent: Mar. 19, 2013

(54) REFLECTION FILM, REFLECTION FILM LAMINATE, LED, ORGANIC EL DISPLAY, AND ORGANIC EL ILLUMINATING INSTRUMENT

(75) Inventors: Jun Suzuki, Kobe (JP); Toshiki Sato, Kobe (JP); Takayuki Tsubota, Kobe (JP); Shinichi Tanifuji, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 283 days.

(21) Appl. No.: 12/679,633

(22) PCT Filed: Sep. 25, 2008

(86) PCT No.: PCT/JP2008/067336
§ 371 (c)(1),
(2), (4) Date: Mar. 23, 2010

(87) PCT Pub. No.: WO2009/041529
PCT Pub. Date: Apr. 2, 2009

(65) Prior Publication Data
US 2010/0195231 A1    Aug. 5, 2010

(30) Foreign Application Priority Data

Sep. 25, 2007 (JP) ................................. 2007-247356
Oct. 5, 2007 (JP) ................................. 2007-262454
Jun. 27, 2008 (JP) ................................. 2008-168977

(51) Int. Cl.
*B32B 17/06* (2006.01)
*B32B 27/36* (2006.01)
*B32B 15/04* (2006.01)

(52) U.S. Cl. ........ 428/434; 428/450; 428/457; 428/469; 428/412

(58) Field of Classification Search .................. 204/501, 204/505, 506; 428/64.4, 697, 700, 701
See application file for complete search history.

(56) References Cited

U.S. PATENT DOCUMENTS

| 7,189,460 | B2 * | 3/2007 | Shin et al. | 428/469 |
| 2003/0132537 | A1 * | 7/2003 | Inaba | 264/1.36 |
| 2004/0226818 | A1 | 11/2004 | Takagi et al. | |
| 2005/0238839 | A1 * | 10/2005 | Takagi et al. | 428/64.6 |
| 2006/0013988 | A1 | 1/2006 | Tauchi et al. | |
| 2006/0068227 | A1 * | 3/2006 | Ukishima et al. | 428/702 |
| 2007/0020427 | A1 | 1/2007 | Fujii et al. | |
| 2007/0110968 | A1 * | 5/2007 | Watanabe | 428/209 |
| 2008/0131308 | A1 * | 6/2008 | Tsubota et al. | 420/501 |

FOREIGN PATENT DOCUMENTS

| CN | 1691167 A | 11/2005 |
| JP | 2000 106017 | 4/2000 |
| JP | 2001 192753 | 7/2001 |
| JP | 2002 129259 | 5/2002 |
| JP | 2005 48231 | 2/2005 |
| JP | 2005 332557 | 12/2005 |
| JP | 2006 1271 | 1/2006 |
| JP | 2006 37169 | 2/2006 |
| JP | 2006 98856 | 4/2006 |
| JP | 2007 65261 | 3/2007 |

OTHER PUBLICATIONS

Japanese Office Action Issued Jun. 12, 2012 in Patent Application No. 2008-168977 (with English translation).
Supplementary European Search Report dated Nov. 5, 2012 received in European Patent Application No. 08834083.1.

* cited by examiner

*Primary Examiner* — David Sample
(74) *Attorney, Agent, or Firm* — Oblon, Spivak, McClelland, Maier & Neustadt, L.L.P.

(57) ABSTRACT

The present invention provides a reflection film, a reflection film laminate which are less likely to undergo agglomeration or sulfidation of an Ag thin film due to heat, and a LED, an organic EL display, and an organic EL illuminating instrument, each including any of these. The reflection film in accordance with the present invention is a reflection film formed on a substrate, characterized by being an Ag alloy film including Ag as a main component, and Bi in an amount of 0.02 atomic percent or more, and further including one or more of V, Ge, and Zn in a total content of 0.02 atomic percent or more, and satisfying the following expression (1):

$$7\times[A]+13\times[Bi]\leq 8 \qquad (1)$$

where [A] (atomic percent) denotes the content of one or more of the V, Ge, and Zn, and [Bi] (atomic percent) denotes the content of Bi. Whereas, a reflection film laminate in accordance with the present invention is a reflection film laminate formed on a substrate, characterized by including: a first film comprising an Ag alloy film including Ag as a main component, and Bi in an amount of 0.02 atomic percent or more, and further including one or more of V, Ge, and Zn in a total content of 0.02 atomic percent or more, and satisfying the expression (1); and a second film including a Si oxide formed on the first film.

25 Claims, 4 Drawing Sheets

F I G . 1
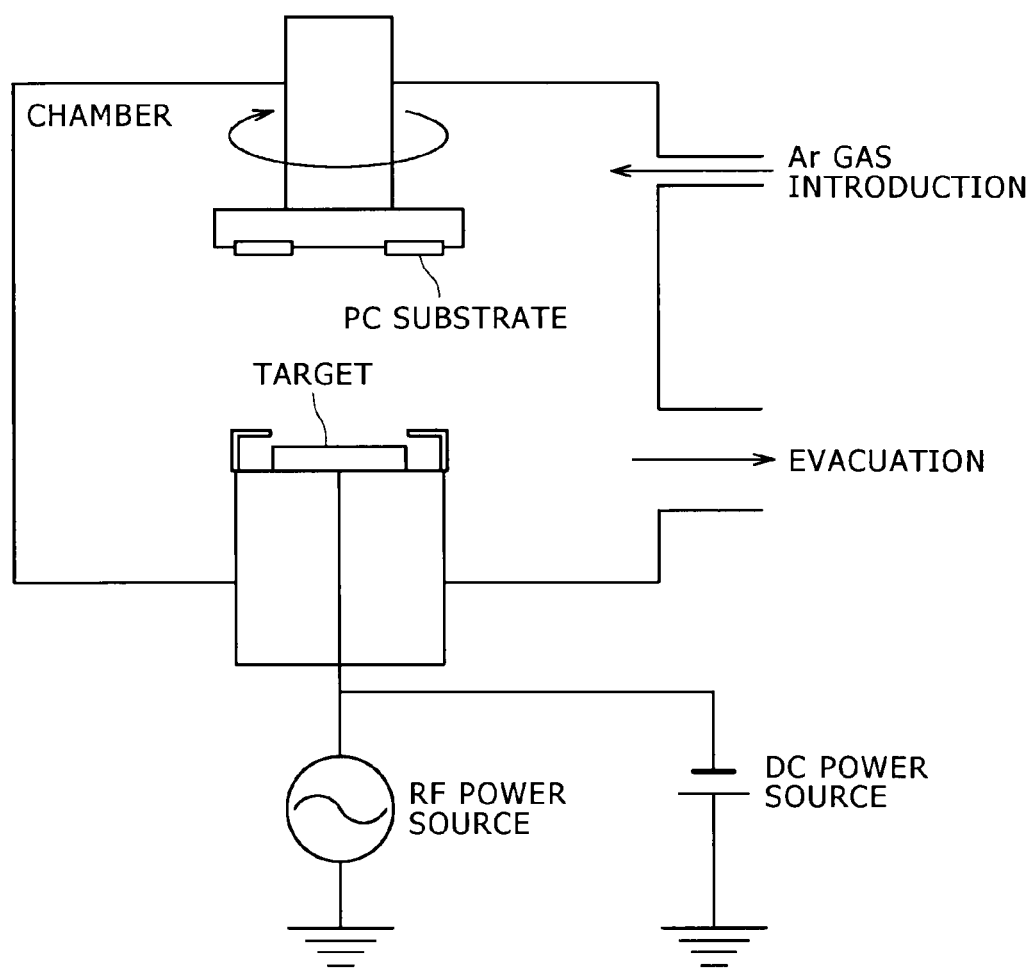

REFLECTION FILM, REFLECTION FILM LAMINATE, LED, ORGANIC EL DISPLAY, AND ORGANIC EL ILLUMINATING INSTRUMENT

CROSS-REFERENCE TO RELATED APPLICATIONS

This application is a National Stage of PCT/JP08/067,336 filed Sep. 25, 2008 and claims the benefit of JP 2007-247356 filed Sep. 25, 2007, JP 2007-262454 filed Oct. 5, 2007 and JP 2008-168977 filed Jun. 27, 2008.

TECHNICAL FIELD

The present invention belongs to a technical field relating to a reflection film, a reflection film laminate, a LED, an organic EL display, and an organic EL lighting instrument. More particularly, the present invention belongs to a technical field relating to a reflection film and a reflection film laminate for use in a LED, an organic EL display, an organic EL illuminating instrument, a vehicular lighting fixture, a reflector for an illumination instrument, or the like.

BACKGROUND ART

An Ag thin film is a material which becomes very high in reflectivity with respect to a visible light when the film thickness is about 70 nm or more, and has a low electric resistivity. For this reason, the Ag thin film has conventionally been employed for uses of an optical mirror and the like, or has been studied on its application to an illuminating instrument reflector, or a reflection electrode film of a LED or an organic EL.

A LED reflection electrode film may be exposed to temperatures as high as about 80 to 200° C. according to circumstances. Therefore, by heat, Ag atoms diffuse and agglomerate, so that the surface of the Ag alloy thin film becomes roughened, resulting in a reduced reflectivity. This is a problem in terms of heat resistance. As for the heat resistance, an attempt has been made to attain an improvement by alloying of Ag. For example, there are proposed an alloy film obtained by adding Au to Ag, and further adding Cu or the like thereto, and a conductor film including an alloy film obtained by adding a noble metal to Ag, and an alloy film obtained by adding a rare earth element to Ag, stacked one on another (JP-A No. 2002-129259, JP-A, No. 2006-1271).

Whereas, the LED reflection electrode film has a problem in terms of sulfidation resistance as follows. There is a time period during which the LED reflection electrode film is exposed the air until resin sealing after deposition. During this period, sulfur in the air diffuses and permeates into a protective film such as a resin film or an oxide film. As a result, the LED reflection electrode film may be discolored to black. As for the sulfidation resistance, an attempt has been made to attain an improvement thereof by alloying of Ag. For example, there are proposed an alloy obtained by adding Ge or In to Ag (JP-A No. 2001-192753, JP-A. No. 2006-37169), and an alloy obtained by adding Zn which is an element for improving the sulfidation resistance to an Ag—Bi alloy high in heat resistance (JP-A No. 2005-48231).

Whereas, the Ag film tends to agglomerate, and has a problem of reduction of reflectivity due to agglomeration. The agglomeration is caused by adsorption of halogen ions in the air onto the Ag film surface together with moisture. For this reason, the Ag film is coated on its surface with a resin such as an UV-curable resin or an acrylic resin, an oxide, or a nitride in order to cut off the outside environment for use (JP-A No. 2000-106017, JP-A No. 2006-98856). However, due to permeation of moisture or halogen ions through pin hole portions, and in addition, in the case of a resin coating, due to diffusion and penetration of moisture or halogen ions through the resin itself, agglomeration occurs. Accordingly, a large number of white spots and discoloration occur in the substrate surface on which the Ag film is deposited. This causes reduction of designability and merchantability.

DISCLOSURE OF THE INVENTION

Problems that the Invention is to Solve

The present invention has been made in view of such circumstances. It is an object thereof to provide a reflection film and a reflection film laminate, which are less likely to undergo agglomeration or sulfidation due to heat of an Ag thin film, and a LED, an organic EL display, and an organic EL illuminating instrument including any of these.

Means for Solving the Problems

A reflection film in accordance with the present application is a reflection film formed on a substrate, characterized by being an Ag alloy film including Ag as a main component, and Bi in an amount of 0.02 atomic percent or more, and further including one or more of V, Ge, and Zn in a total content of 0.02 atomic percent or more, and satisfying the following expression (1):

$$7\times[A]+13\times[Bi]\leqq 8 \qquad (1)$$

where [A] (atomic percent) denotes the content of one or more of the V, Ge, and Zn, and [Bi] (atomic percent) denotes the content of Bi.

It is preferable that the reflection film has a layer having a higher content of one or more of V, Ge, and Zn than in the inside of the Ag alloy film, on the surface of the Ag alloy film.

It is preferable that the layer having a higher content of one or more of V, Ge, and Zn includes an oxide of one or more of V, Ge, and Zn.

It is preferable that the Ag alloy film further includes one or more of Au, Pt, Pd, and Rh in a total content of 0.1 to 5 atomic percent.

Whereas, a reflection film laminate in accordance with the present application is a reflection film laminate formed on a substrate, characterized by including: a first film including an Ag alloy film including Ag as a main component, and Bi in an amount of 0.02 atomic percent or more, and further including one or more of V, Ge, and Zn in a total content of 0.02 atomic percent or more, and satisfying the following expression (1):

$$7\times[A]+13\times[Bi]\leqq 8 \qquad (1)$$

where [A] (atomic percent) denotes the content of one or more of the V, Ge, and Zn, and [Bi] (atomic percent) denotes the content of Bi; and a second film including an oxide of Si, formed on the first film.

It is preferable that the reflection film laminate has a layer having a higher content of one or more of V, Ge, and Zn than in the inside of the Ag alloy film, at the interface between the first film including the Ag alloy film and the second film including an oxide of Si.

It is preferable that the layer having a higher content of one or more of V, Ge, and Zn includes an oxide of one or more of V, Ge, and Zn.

It is preferable that the first film further includes one or more of Au, Pt, Pd, and Rh in a total content of 0.1 to 5 atomic percent.

It is preferable that, when assuming that the second film containing an oxide of Si is $SiO_2$, the density of the film is measured with an X-ray reflectivity method, and analyzed with a model divided into three layers, the density of the layer in contact with at least the first film including the Ag alloy film out of the three layers is $2\ g/cm^3$ or more.

It is preferable that the thickness of the second film is 5 to 80 nm.

For the reflection film laminate, it is preferable that the visible light reflectivity measured with a light within the wavelength range of 380 to 780 nm from a D65 light source according to JIS R3106 is 93% or more.

It is preferable that a plasma polymerization film is further formed on the second film.

It is preferable that a film including a metal film, a metal oxide film, a plasma polymerization film, or a resin film is formed between the substrate and the first film.

Whereas, the present invention relates to a vehicular lighting fixture, an illuminating instrument, a LED, an organic EL display, an organic El illuminating instrument, and an optical mirror, each including the reflection film or the reflection film laminate described above.

Advantage of the Invention

For a reflection film in accordance with the present invention, agglomeration or sulfidation due to heat of an Ag alloy film is less likely to occur. For this reason, a high reflectivity is held for a long period. Further, a high reflectivity is held for a long period. Still further, a reflection film laminate in accordance with the present invention can improve the protective performance of a protective film by optimization of the combination of the Ag alloy composition and the protective film. As a result, the agglomeration and sulfidation of the Ag alloy film are less likely to occur. For this reason, it is possible to improve the durability thereof. When the reflection film or the reflection film laminate in accordance with the present invention is utilized for a LED, an organic EL display, or an organic EL illuminating instrument, it is possible to improve the durability of the LED, the organic EL display, or the organic EL illuminating instrument.

BRIEF DESCRIPTION OF THE DRAWINGS

FIG. 1 A schematic view showing a sputtering apparatus used for manufacturing (deposition) of a reflection film and a reflection film laminate in accordance with a first invention and a second invention;

BEST MODE FOR CARRYING OUT THE INVENTION

<1> First Invention

Figure 2:
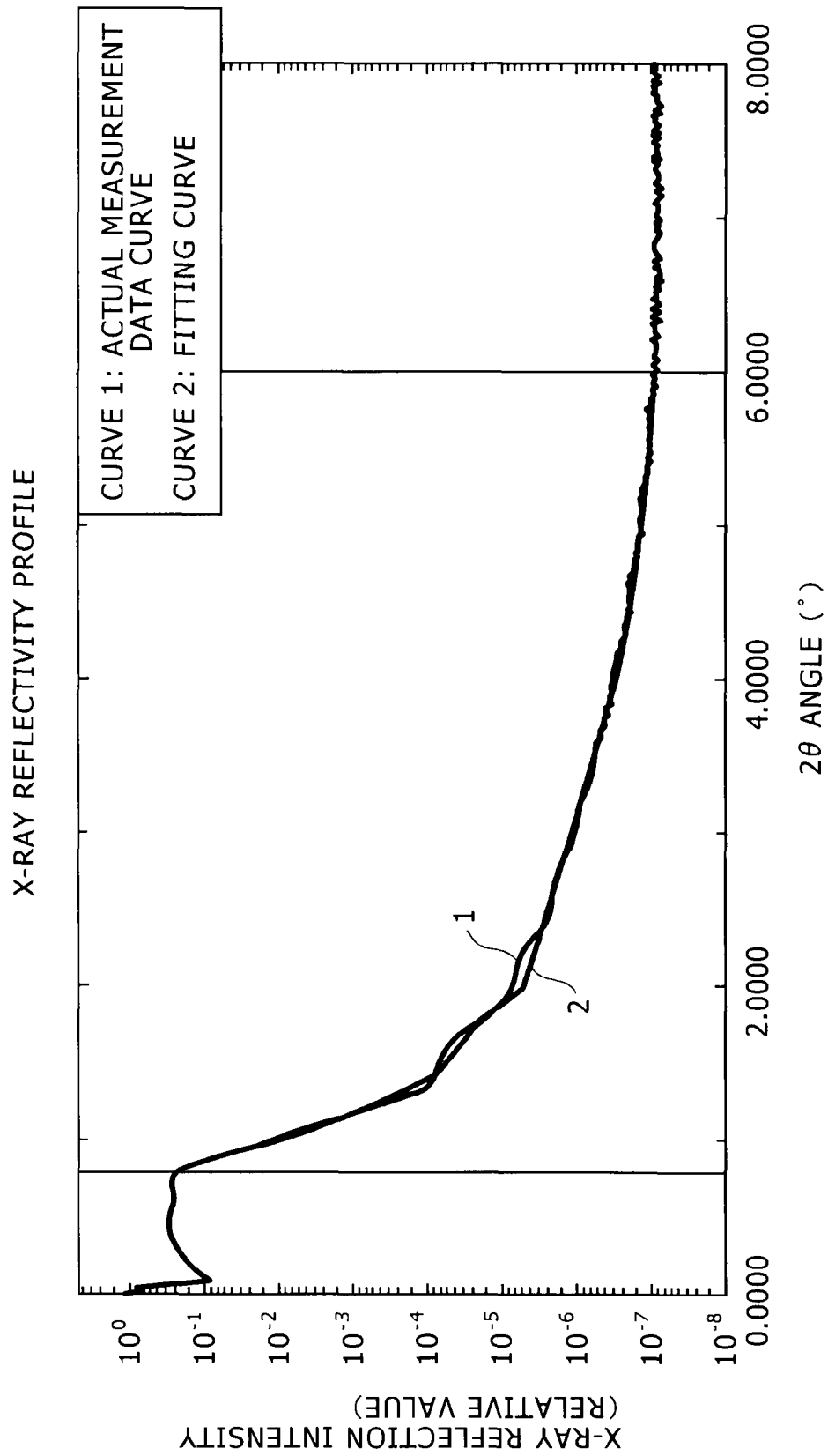
FIG. 2 A view showing analysis results when a $SiO_2$ film in accordance with Embodiment 5 has been analyzed with a one-layer model.

A reflection film in accordance with the present invention is, as described above, characterized by being, on a substrate, an Ag alloy film including Ag as a main component, and Bi in an amount of 0.02 atomic percent or more, and further including one or more of V, Ge, and Zn in a total content of 0.02 atomic percent or more, and satisfying the following expression (1):

$$7 \times [A] + 13 \times [Bi] \leq 8 \tag{1}$$

where [A] (atomic percent) denotes the content of one or more of the V, Ge, and Zn, and [Bi] (atomic percent) denotes the content of Bi.

In the reflection film in accordance with the present invention, the Ag alloy forming the Ag alloy film includes Bi in an amount of 0.02 atomic percent or more, and further includes one or more of V, Ge, and Zn in a total content of 0.02 atomic percent or more, and satisfies the following expression (1):

$$7 \times [A] + 13 \times [Bi] \leq 8 \tag{1}$$

where [A] (atomic percent) denotes the content of one or more of the V, Ge, and Zn, and [Bi] (atomic percent) denotes the content of Bi.

Bi exhibits an effect of inhibiting crystal grain growth and agglomeration of the Ag film due to heat in a content of 0.02 atomic percent or more. Namely, the heat resistance is improved, so that agglomeration of the Ag film becomes less likely to occur. In other words, the agglomeration resistance is improved. For this reason, the content of Bi is required to be set at 0.02 atomic percent or more. V, Ge, and Zn have an effect of enhancing the sulfidation resistance, and inhibiting discoloration upon contact with a sulfide such as hydrogen sulfide. In order to exhibit this effect, the total content of one or more of V, Ge, and Zn is required to be set at 0.02 atomic percent or more.

The Ag alloy forming the Ag alloy film in the reflection film in accordance with the present invention is, as described above, required not also to contain Bi and A (one or more of V, Ge, and Zn) as described above, but also to have a content of the A [A] and a content of Bi [Bi] satisfying the expression (1). This is due to the following. When the contents of A and Bi do not satisfy the expression (1), the reflectivity of the Ag alloy film is reduced to less than 93%. When the contents of A and Bi satisfy the expression (1) where the value of the right side is 6, the reflectivity is improved. When the contents of A and Bi satisfy the expression (1) where the value of the right side is 4, the reflectivity is further desirably improved.

The reflection film in accordance with the present invention desirably has a layer having a higher content of one or more of V, Ge, and Zn than in the inside of the Ag alloy film at the surface of the Ag alloy film. When the Ag alloy film containing one or more of V, Ge, and Zn is exposed to an atmosphere containing oxygen present therein during deposition or after deposition, one or more of V, Ge, and Zn diffuse to the surface of the Ag alloy film, and combine with oxygen. This results in the formation of a layer having a higher content of one or more of V, Ge, and Zn than in the inside of the Ag alloy film at the surface of the Ag alloy film. Thus, at least some of one or more of V, Ge, and Zn is present in the form of an oxide. Conceivably, the layer, in which at least some of one or more of V, Ge, and Zn is present in the form of an oxide, cuts off the Ag alloy film from environment, and reduces the surface energy of Ag. Therefore, the surface diffusion of Ag is inhibited, which can inhibit agglomeration of Ag.

The reflection film in accordance with the present invention has a film thickness of preferably 70 to 500 mm, further preferably 100 to 400 nm, and more preferably 150 to 300 mm. This is for the following reasons. A 70-nm or more film thickness is required for obtaining the total reflection. Further, the agglomeration of Ag due to heat or halogen ions also depends upon the film thickness of the Ag alloy film, and agglomeration becomes less likely to occur with an increase in film thickness. On the other hand, the upper limit of the film thickness is desirably 500 nm or less in terms of cost.

The Ag alloy forming the Ag alloy film in the reflection film in accordance with the present invention desirably further contains one or more of Au, Pt, Pd, and Rh in a total content of 0.1 to 5 atomic percent.

In order to further enhance the durability of the reflection film in accordance with the present invention, it is preferable to form a transparent protective film. When the reflection film in accordance with the present invention is used as a LED reflection electrode film, finally, the reflection electrode film is embedded in the resin, resulting in a state cut off from environment. On the other hand, in use for a vehicular lighting fixture, a reflector for illumination, or the like, the Ag alloy film is in an exposed state. Thus, the Ag alloy film may be exposed to halogen ions, sulfur components, moisture, and the like in environment. In such a case, the reflectivity may be reduced with time. In order to keep a high reflectivity for a longer period, it is necessary to cut off the environmental factors as described above. Further, also in order to prevent reduction of the reflectivity, a transparent protective film is preferably used. As the transparent protective film, there can be preferably used a plasma polymerization film using an oxide of Si, Al, Ti, or the like, and mixed oxides thereof, glass, organic silicon, or the like as a raw material, a transparent coating, a transparent resin film, or the like. Alternatively, a colored transparent coating or the like can also be used depending upon an object of changing the color tone according to use.

According to the material of a substrate for forming the reflection film in accordance with the present invention, the adhesion between the substrate and the reflection film may change. For example, when the material of the substrate is a metal, the adhesion is relatively good. However, in the case of glass or a resin, the adhesion tends to be inferior. Whereas, in the case where dirt or fine dust containing halogen ions or a sulfur component is attached on the substrate surface, when the Ag alloy film is formed on the substrate as it is, agglomeration of Ag occurs at the dust portion. Accordingly, the agglomeration reaches the Ag alloy film surface with an elapse of time. In due time, the reflectivity may be reduced. In order to improve the stability of such an adhesion, and to prevent Ag agglomeration due to dust on the substrate surface, it is preferable to put an underlayer film at the interface between the substrate and the Ag reflection film. As the underlayer film, there can be used a thin film of an elemental metal such as Cu, Ni, Co, W, Mo, Ta, Cr, or Ti, or an alloy thereof, a metal oxide film, a plasma polymerization film using organic silicon or the like as a raw material, a resin film including a coating film, or the like.

The material commonly used as a material for a LED, an organic EL display, an organic EL illuminating instrument, a vehicular lighting fixture, and a reflection film for illumination is Al. The reflectivity thereof is about 85%. In contrast, the Ag alloy reflection film in accordance with the present invention has a high reflectivity. The visible light reflectivity measured with a light within the wavelength range of 380 to 780 nm from a D65 light source according to JIS R3106 can be set at 93% or more. Use of a reflection electrode film and a reflection film with such a high reflectivity can provide a higher luminance than with the case where a conventional Al reflection film is used. Further, use of a reflection electrode film and a reflection film with such a high reflectivity can reduce the power consumption of the light source. When a plurality of light sources are used, the number of light sources can be reduced. This can reduce the cost required for the light sources. Therefore, the reflection film in accordance with the present invention can be preferably used as the reflection electrode film of a LED or the reflection electrode film of an organic EL. Alternatively, the reflection film in accordance with the present invention can be combined with a transparent protective film as described above, thereby to be preferably used a vehicular lighting fixture or a reflection film for illumination.

It is recommended that the reflection film in accordance with the present invention is deposited using a sputtering process using an Ag alloy sputtering target. Particularly, it is preferable that the reflection film is deposited by a DC sputtering process using a direct-current cathode.

The Ag alloy forming the Ag alloy film in the reflection film in accordance with the present invention contains, as components, Bi and A (one or more of V, Ge, and Zn), or further contains one or more of Au, Pt, Pd, and Rh. At this step, if required, the Ag alloy may contain an element other than the foregoing elements. Therefore, the Ag alloy may contain only the foregoing elements, or may contain the foregoing elements and other elements than the foregoing elements.

When the Ag alloy contains only the foregoing elements, and contains only Bi and A (one or more of V, Ge, and Zn), the Ag alloy foaming the Ag alloy film in the reflection film in accordance with the present invention can be expressed as: "an Ag alloy containing Bi in an amount of 0.02 atomic percent or more, and further containing one or more of V, Ge, and Zn in a total content of 0.02 atomic percent or more, the balance including inevitable impurities and Ag, and satisfying the expression (1) $[7\times[A]+13\times[Bi]\leqq 8]$ where [A] (atomic percent) denotes the content of one or more of the Ge, and Zn, and [Bi] (atomic percent) denotes the content of Bi"; "an Ag alloy containing Bi in an amount of 0.02 atomic percent or more, and further containing one or more of V, Ge, and Zn in a total content of 0.02 atomic percent or more, the balance including inevitable impurities and Ag, the Ag alloy satisfying the expression (1) $[7\times[A]+13\times[Bi]\leqq 8]$ where (atomic percent) denotes the content of one or more of the V, Ge, and Zn, and [Bi] (atomic percent) denotes the content of Bi"; or the like.

When the Ag alloy contains only the foregoing elements, and contains only Bi and A (one or more of V, Ge, and Zn), and one or more of Au, Pt, Pd, and Rh, the Ag alloy forming the Ag alloy film in the reflection film in accordance with the present invention can be expressed as: "an Ag alloy containing Bi in an amount of 0.02 atomic percent or more, and containing one or more of V, Ge, and Zn in a total content of 0.02 atomic percent or more, and further containing one or more of Au, Pt, Pd, and Rh in a total content of 0.1 to 5 atomic percent, the balance including inevitable impurities and Ag, and satisfying the expression (1) $[7\times[A]+13\times[Bi]\leqq 8]$ where [A] (atomic percent) denotes the content of one or more of the V, Ge, and Zn, and [Bi] (atomic percent) denotes the content of Bi"; "an Ag alloy containing Bi in an amount of 0.02 atomic percent or more, and containing one or more of V, Ge, and Zn in a total content of 0.02 atomic percent or more, and further containing one or more of Au, Pt, Pd, and Rh in a total content of 0.1 to 5 atomic percent, the balance including inevitable impurities and Ag, the Ag alloy satisfying the expression (1) $[7\times[A]+13\times[Bi]\leqq 8]$ where [A] (atomic percent) denotes the content of one or more of the V, Ge, and Zn, and [Bi] (atomic percent) denotes the content of Bi"; or the like.

Examples

Embodiments 1 to 3

Examples and Comparative Examples of a first invention of the present invention will be described below. Incidentally, the first invention is not limited to the Examples, and can be carried out with proper changes added thereto within the scope adaptable to the gist of the present invention. All of these are included in the technical range of the present invention.

Embodiment 1

In a chamber of a sputtering apparatus as shown in FIG. 1, a pure Ag or Ag—Bi alloy target (a target including pure Ag or a target including an Ag—Bi alloy) with a diameter of 100 mm and a thickness of 5 mm was set. A polycarbonate (PC) substrate with a diameter of 50 mm and a thickness of 1 mm was set so as to face the target. Thus, vacuum evacuation was carried out so that the pressure inside the chamber was $1\times10^{-5}$ Torr or less. Thereafter, an Ar gas was introduced into the chamber, so that the pressure in the chamber was $2\times10^{-3}$ Torr. Thus, the target was applied with DC (direct current) to generate a plasma. As a result, the target was sputtered with a DC power of 200 W, thereby to deposit a pure Ag thin film or an Ag alloy thin film on the PC substrate with a thickness of 250 nm.

At this step, as the target, a pure Ag target was used for deposition of a pure Ag thin film. In the case of deposition of an Ag alloy thin film not containing Bi, deposition was carried out using the one including a metal chip of the alloy element put on a pure Ag target. In the case of an Ag alloy thin film containing Bi and other elements than Bi, deposition was carried out using the one including a metal chip of an element other than Bi put on an Ag—Bi alloy target. Incidentally, the distance between the target and the PC substrate was set at 80 mm. Thus, deposition was carried out while revolving the PC substrate. The contents of various additive elements in the Ag alloy thin film thus deposited were measured with an ICP (Inductivity Coupled Plasma) optical emission mass spectrometry. Namely, using an acid capable of dissolving both Ag and the additive elements, the Ag alloy thin film was dissolved. Then, the ratios of Ag and the additive elements in the resulting solution were measured with the ICP optical emission mass spectrometry, and the values were normalized to 100% to be taken as the composition of the Ag alloy film. Incidentally, the composition was determined in terms of atomic percent.

The values of the component composition of the thin film (i.e., reflection film) thus obtained, $[7\times[A]+13\times[Bi]]$ are shown in Table 1. As for these reflection films, each visible light reflectivity (initial reflectivity) was measured by a light within the wavelength range of 380 to 780 nm from a D65 light source according to JIS R3106. Then, the sulfidation resistance test (sulfidation resistance test (1)) and the heat resistance test (heat resistance test (1)) held under the following conditions were carried out.

[Sulfidation Resistance Test (1)]
Test solution composition: 0.5% ammonium sulfide aqueous solution;
Exposure position: set so that the deposited surface faces the liquid surface at a height of 5 cm from the liquid surface of the test solution; and
Exposure time: 5 minutes
[Heat Resistance Test (1)]
Test atmosphere: air
Test temperature: 200° C.; and
Test time: 5 hours As for each reflection film after the sulfidation resistance test (1), with the same method as with the measurement of the initial reflectivity, the visible light reflectivity for a light within the wavelength range of 380 to 780 nm was measured. Thus, the difference from the initial reflectivity [i.e., difference in reflectivity between before and after the test=initial reflectivity (%)−reflectivity (%) after sulfidation resistance test] was determined. Thus, the sulfidation resistance was evaluated based on the difference in reflectivity. The one with the difference in reflectivity of 2% or less was rated as ⊚; more than 2% and 4% or less, as ○; more than 4% and 6% or less, as Δ; and more than 6%, as x.

As for each reflection film after the heat resistance test (1), with the same method as with the measurement of the reflectivity of the sulfidation resistance test (1) (i.e., the same method as with the measurement of the initial reflectivity), the visible light reflectivity for a light within the wavelength range of 380 to 780 nm was measured. Thus, the difference from the initial reflectivity [i.e., difference in reflectivity between before and after the test=initial reflectivity (%)−reflectivity (%) after heat resistance test] was determined. Thus, the heat resistance was evaluated based on the difference in reflectivity. The one with the difference in reflectivity of 1% or less was rated as more than 1% and 3% or less, as ○; more than 3% and 5% or less, as Δ; and more than 5%, as x.

The one showing the result of the sulfidation resistance test (1) of ○ or ⊚, and showing the result of the heat resistance test (1) of ○ or ⊚ was rated as acceptable, and other ones were rated as unacceptable.

The results of the sulfidation resistance test (1) and the heat resistance test (1) are shown in Table 1.

As indicated from Table 1, for Comparative Example Nos. 1, 2, 12, 13, and 14, the samples were remarkably reduced in both or either of the reflectivity after the sulfidation resistance test (1) and the reflectivity after the heat resistance test (1), and hence rated as unacceptable. On the other hand, for Comparative Example Nos. 10 and 11, the samples were sufficient in durability, but each show a value of $[7\times[A]+13\times[Bi]]$ of more than 8. Accordingly, each sample shows an initial reflectivity as low as less than 93%, and thus is unfavorably insufficient in terms of reflectivity.

In the cases of Examples (Nos. 3 to 9) of the present invention, in any case, the results of the sulfidation resistance test (1) are ○ or ⊚, and the results of the heat resistance test (1) are ○ or ⊚. Thus, the samples are excellent in sulfidation resistance and heat resistance. Each sample shows an initial reflectivity as high as 93% or more, and thus is favorably sufficient in terms of reflectivity.

Embodiment 2

In the same manner as in the Embodiment 1, on a glass substrate, an Ag alloy thin film of the same composition as each of Nos. 1 to 6, 12, and 13 of Table 1 was deposited with a film thickness of 150 nm. Then, imitating the state of a LED, on the Ag alloy thin film, a silicon resin (manufactured by Shin-Etsu Chemical Co., Ltd.) was coated with a thickness of about 20 μm, and was heat treated at 200° C. for 60 minutes to be hardened. As a result, laminate samples Nos. 15 to 22 of the Ag alloy film and the silicon resin were obtained.

As for these laminate samples (laminate films), each visible light reflectivity (initial reflectivity) was measured by a light within the wavelength range of 380 to 780 nm from a D65 light source according to JIS R3106. Then, the heat resistance test (heat resistance test (2)) held under the following conditions was carried out.

[Heat Resistance Test (2)]
Test atmosphere: air;
Test temperature: 150° C.; and
Test time: 1000 hours As for each reflection film after the heat resistance test, the visible light reflectivity for a light within the wavelength range of 380 to 780 nm was measured in the same manner as in the Example 1. Thus, the difference from the initial reflectivity [i.e., difference in reflectivity between before and after the test=initial reflectivity (%)−reflectivity (75) after heat resistance test] was determined. Thus, the heat resistance was evaluated based on the difference in reflectivity. The one with the difference in reflectivity of 0.5% or less was rated as ⊚; more than 0.5% and 1% or less, as ○; more than 1% and 3% or less, as △; and more than 3%, as x. The results of the heat resistance test (2) are shown in Table 2. The one showing the result of the heat resistance test (2) of ○ or ⊚ was rated as acceptable, and other ones were rated as unacceptable.

As indicated from Table 2, for Nos. 15, 16, 21, and 22 of Comparative Examples, the samples have been coated with a silicon resin. In spite of this, however, each sample was reduced in reflectivity after the heat resistance test (2), and was rated as unacceptable.

In the cases of Examples (Nos. 17 to 20) of the present invention, in any case, the results of the heat resistance test (2) are ○ or ⊚. Thus, the samples are excellent in heat resistance.

Embodiment 3

The concentration change and state analyses of each element in the Ag alloy films of Nos. 3, 4, 5, and 6 of Table 1 were carried out with X-ray photoelectron spectroscopic analysis. The analyses were carried out under the following conditions. As a result, it has been confirmed that Ge in the Ag alloy film for Nos. 3 and 4, V in the Ag alloy film for No. 5, and Zn in the Ag alloy film for No. 6 were respectively present in a higher concentration at the outermost surface than in the film inside. Further, from the analysis results of the bond energy by the X-ray photoelectron spectroscopic analysis, it has been confirmed that Ge at the outermost surface is present in the form of an oxide for Nos. 3 and 4.

[X-ray Photoelectron Spectroscopic Analysis Measuring Conditions]
Apparatus: Quantera SXM fully automated scanning type X-ray photoelectron spectrometer, manufactured by Physical Electronics Co.;
X-ray source: monochromatized Al Kα;
X-ray output: 43.7 W;
X-ray beam diameter: 200 μm;
Photoelectron extraction angle: 45°; and
Ar$^+$ sputtering speed: about 4.6 nm/min in terms of SiO$_2$ Incidentally, as also indicated from the results of Embodiment 3, V, Ge, or Zn in each reflection film (i.e., Ag alloy thin film) in accordance with Examples of the Embodiment 1 is present in a larger quantity at the outermost surface than in the film inside. In each reflection film in accordance with the present invention, A (one or more of V, Ge, and Zn) is present in a larger quantity at the outermost surface than in the film inside. The outermost surface, at which A (one or more of V, Ge, and Zn) is present in a larger quantity, corresponds to a layer having a larger content of A (one or more of V, Ge, and Zn) in each reflection film in accordance with the present invention.

The composition of the film inside of each reflection film in accordance with Examples of the Embodiment 1 satisfies the composition requirements of the Ag alloy of the first layer of the reflection film in accordance with the present invention. Therefore, the reflection film in accordance with Examples in the Embodiment 1 is the one obtained with the foregoing deposition method. However, the first layer containing the Ag alloy satisfying the composition requirements of the Ag alloy of the first layer of the reflection film in accordance with the present invention has been formed. For this reason, the reflection film in accordance with Examples of the Embodiment 1 can be said to be the reflection film in accordance with the present invention.

TABLE 1

| | Ag alloy composition (atomic percent) | 7 × [A] + 13 × [Bi] | Initial reflectivity (%) | Sulfidation resistance test (1) results | Heat resistance test (1) results | Remarks |
|---|---|---|---|---|---|---|
| 1 | Ag | 0 | 96.9 | X | X | Comparative Example |
| 2 | Ag—0.08Bi | 1.04 | 96.4 | X | ○ | Comparative Example |
| 3 | Ag—0.1Bi—0.1Ge | 2.0 | 96.1 | ⊚ | ⊚ | Example |
| 4 | Ag—0.07Bi—0.15Ge | 1.96 | 95.8 | ⊚ | ⊚ | Example |
| 5 | Ag—0.15Bi—0.3V | 4.05 | 94.9 | ○ | ⊚ | Example |
| 6 | Ag—0.08Bi—0.1Zn | 1.74 | 95.2 | ○ | ○ | Example |
| 7 | Ag—0.07Bi0.1Ge—0.5Au | 1.61 | 95.5 | ○ | ⊚ | Example |
| 8 | Ag—0.1Bi—0.2V—0.5Pd | 2.7 | 95.9 | ○ | ⊚ | Example |
| 9 | Ag—0.1Bi—0.05Zn—0.5Au | 1.65 | 95.7 | ○ | ○ | Example |
| 10 | Ag—0.15Bi—1.2Ge | 10.35 | 90.4 | ⊚ | ⊚ | Comparative Example |
| 11 | Ag—0.2Bi—2Zn | 16.6 | 89.1 | ○ | ○ | Comparative Example |
| 12 | Ag—0.1Ge | 0.7 | 96.2 | △ | △ | Comparative Example |
| 13 | Ag—0.2Zn | 1.4 | 95.3 | X | X | Comparative Example |
| 14 | Ag—0.1Bi—0.5Au | 1.3 | 96.0 | X | ○ | Comparative Example |

TABLE 2

| Ag alloy composition (atomic percent) | 7 × [A] + 13 × [Bi] | Silicon resin coating | Initial reflectivity (%) | Heat resistance test (2) results | Remarks |
|---|---|---|---|---|---|
| 15 Ag | 0 | Applied | 95.4 | X | Comparative Example |
| 16 Ag—0.08Bi | 1.04 | Applied | 95.0 | Δ | Comparative Example |
| 17 Ag—0.1Bi—0.1Ge | 2.0 | Applied | 94.7 | ⊚ | Example |
| 18 Ag—0.07Bi—0.15Ge | 1.96 | Applied | 94.2 | ⊚ | Example |
| 19 Ag—0.15Bi—0.3V | 4.05 | Applied | 93.2 | ⊚ | Example |
| 20 Ag—0.08Bi—0.1Zn | 1.74 | Applied | 93.7 | ○ | Example |
| 21 Ag—0.1Ge | 0.7 | Applied | 94.8 | Δ | Comparative Example |
| 22 Ag—0.2Zn | 1.4 | Applied | 93.4 | X | Comparative Example |

<2> Second Invention

The present inventors conducted a study on the alloy improved in agglomeration due to halogen ions and heat, and as a result, they found an Ag—Bi alloy (JP-A No. 2004-139712). However, With the Ag—Bi alloy, the sulfidation resistance cannot be sufficiently improved. Under such circumstances, for the Ag alloy film obtained by adding various elements to an Ag—Bi alloy, the sulfidation resistance test was carried out. As a result, some Ag alloy films alone may be more improved in sulfidation resistance than the Ag—Bi alloy. However, no Ag alloy keeps a reflectivity of 93% or more. This leads to the following conclusion. In order to inhibit the sulfidation, a protective film is essential.

As described above, in order to inhibit the reaction with a sulfur compound or halogen ions, it is necessary to form a protective film for cutting off the Ag alloy film from outside environment. However, the Ag alloy film is used as a reflection film, the protective film therefor must be colorless and transparent. As the transparent protective films, there are oxide films of silica, alumina, titania, and the like. However, even when such a colorless transparent protective film is simply deposited on a pure Ag or Ag alloy thin film, formation of pin holes is inevitable. Further, the density of the protective film is low. For this reason, for example, when a sulfidation test is performed in which the protective film is exposed to above a 5% ammonium sulfate aqueous solution, to be brought into contact with an evaporating hydrogen sulfide gas, a large number of brown spot-like sulfides are formed, or the whole film is discolored to yellow. Alternatively, the protective film is allowed to stand in a 120 to 130° C. air atmosphere. Then, sulfur in the air diffuses into the protective film, and reacts with the Ag alloy. Accordingly, yellowing due to sulfidation gradually proceeds.

Under such circumstances, the present inventors pursued a close study focusing attention on the following fact: the density of the protective film is improved by selecting the elements to be added to the Ag—Bi alloy improved in agglomeration due to heat, or controlling the composition thereof. As a result, the present inventors found the following: with a given combination of the additive element species to the Ag—Bi alloy and the concentration thereof, and the type of a film for use as the protective film, pin holes of the protective film can be reduced; in addition, the protective film is densified, thereby to inhibit penetration of a hydrogen sulfide gas through the entire film surface. The present inventors found the following: thus, the environment cut-off property of the protective film (performance of cutting off the contact between the Ag alloy and various affective substances in environment) of the protective film can be enhanced; as a result, the sulfidation resistance is improved, and the resistance against agglomeration (agglomeration resistance) due to halogen ions can be improved. This led to completion of the present invention.

The reflection film laminate in accordance with the present invention, thus completed, is characterized by including a first film including an Ag alloy including Ag as a main component, and Bi in an amount of 0.02 atomic percent or more, and further including one or more of V, Ge, and Zn in a total content of 0.02 atomic percent or more, and satisfying the following expression (1):

$$7\times[A]+13\times[Bi]\leqq 8 \quad (1)$$

where [A] (atomic percent) denotes the content of one or more of the V, Ge, and Zn, and [Bi] (atomic percent) denotes the content of Bi, formed on a substrate; and a second film including an oxide of Si formed thereon.

In the reflection film laminate in accordance with the present invention, the Ag alloy forming the first layer contains Bi in an amount of 0.02 atomic percent or more, and further contains one or more of V, Ge, and Zn in a total content of 0.02 atomic percent or more, and satisfies the following expression (1):

$$7\times[A]+13\times[Bi]\leqq 8 \quad (1)$$

where [A] (atomic percent) denotes the content of one or more of the V, Ge, and Zn, and [Bi] (atomic percent) denotes the content of Bi.

Inclusion of Bi in an amount of 0.02 atomic percent or more produces an effect of inhibiting growth or agglomeration of crystal grains of the Ag film due to heat. Namely, the heat resistance is improved, so that agglomeration of the Ag film becomes less likely to occur, resulting in an improvement of the agglomeration resistance. For this reason, the Bi content is required to be set at 0.02 atomic percent or more. Further, as described later, simultaneous addition with the element A densifies the second film, and reduces pin holes. Also in order to thus enhance the protective performance of the second film, Bi is required to be added in an amount of 0.02 atomic percent or more. Bi is desirably added in an amount of preferably 0.05 atomic percent or more, and more preferably 0.08 atomic percent or more. From the viewpoints described up to this point, the Bi content of the Ag alloy of the first film in accordance with the present invention is set at 0.02 atomic percent or more.

Inclusion of A (one or more of V, Ge, and Zn) in a total content of 0.02 atomic percent or more with the Bi makes the second film dense, and reduces pin holes, resulting in an enhancement of the protective performance. In other words, the durability as a protective film of the second film is improved. When the total content of A (which will be also referred to as the A content) is less than 0.02 atomic percent, the effect of improving the protective performance of the second film cannot be obtained. For this reason, the A content is required to be 0.02 atomic percent or more. A is desirably contained in an amount of preferably 0.05 atomic percent or more, and more preferably 0.08 atomic percent or more. From the viewpoints described up to this point, the A content of the Ag alloy of the first film in accordance with the present invention is set at 0.02 atomic percent or more.

The Ag alloy forming the first film is required not only to contain Bi and A (one or more of V, Ge, and Zn) as described above, but also to have the A content [A] and the Bi content [Bi] satisfying the expression (1). This is due to the following. When the contents of A and Bi do not satisfy the expression (1), the reflectivity of the Ag alloy film is reduced to less than 93%. When the contents of A and Bi satisfy the expression (1) where the value of the right side is 6, the reflectivity is improved. When the contents of A and Bi satisfy the expression (1) where the value of the right side is 4, the reflectivity is further desirably improved.

Whereas, the first film preferably has a layer having a higher content of one or more of V, Ge, and Zn on the interface side of the second film containing an oxide of Si than in the inside of the Ag alloy film. Further, the layer having a higher content of one or more of V, Ge, and Zn preferably contains an oxide thereof. This conceivably causes one or more of V, Ge, and Zn, or an oxide thereof to concentrate toward the interface of the second film containing an oxide of Si, which densifies the Si oxide layer of the second layer, and reduces pin holes therein.

The first film has a film thickness of preferably 70 to 500 nm, further preferably 100 to 400 nm, and more preferably 150 to 300 nm. This is for the following reasons. A 70-nm or more film thickness is required for obtaining the total reflection. Further, the agglomeration of Ag due to heat or halogen ions also depends upon the film thickness of the Ag alloy film, and agglomeration becomes less likely to occur with an increase in film thickness. On the other hand, the upper limit of the film thickness is desirably 500 nm or less in terms of cost.

The second film acts as a protective film for cutting off the first film (the Ag alloy) from outside environment, and must be colorless and transparent. As the transparent oxide films, other than an oxide film including an oxide of Si, there are oxide films of $SnO_2$, ZnO, and the like. However, any of the oxide films including $SnO_2$, ZnO, and the like are colored in yellow or the like, and hence cannot reproduce the color of light from a light source. In contrast, all of oxide films including oxides of Si, Al, or Ti are colorless and transparent.

When an oxide film including an oxide of Al or Ti is used as the second film out of the oxide films including the colorless and transparent metal oxides, and the composition of the Ag alloy of the first film is the foregoing composition, it is possible to obtain an effect of improving the sulfidation resistance and the heat resistance. However, the effect is lower than that with an oxide of Si, and particularly, the sulfidation resistance is insufficient. In contrast, when an oxide film including a metal oxide of Si is used as the second film, and the composition of the Ag alloy of the first film is the foregoing composition, it is possible to obtain an effect of improving the sulfidation resistance as described above. Further, for the oxide of Al or Ti, the deposition speed is 1/10 or less that of $SiO_2$, and the productivity is remarkably inferior. From the viewpoints described up to this point, it is configured such that the second film in accordance with the present invention contains an oxide of Si.

In the reflection film laminate in accordance with the present invention, the second film containing an oxide of Si is assumed to be $SiO_2$. Thus, the density of the film is measured with an X-ray reflectivity method, and analyzed with a model divided into three layers. At this step, the density of a layer in contact with at least the first film including the Ag alloy out of the three layers is desirably 2 $g/cm^3$ or more. The theoretical density of $SiO_2$ is about 2.7 $g/cm^3$ (value of quartz). Thus, in order to inhibit sulfidation by hydrogen sulfide, it is preferable that the $SiO_2$ layer is more dense, i.e., has been faulted with a density closer to the theoretical density. In general, when a $SiO_2$ layer is formed by a sputtering process, a gradient in density is caused in the layer. The density of the $SiO_2$ layer at this step can be measured with the X-ray reflectivity method. For example, when analysis is carried out with a model divided into three layers, information regarding the density gradient can be obtained. The present inventors have conducted a close study, and found the following. When the second film contains Ag as a main component, and Bi in an amount of 0.02 atomic percent or more, and further contains A (one or more of V, Ge, and Zn) in an amount of 0.02 atomic percent or more, the second film is measured with the X-ray reflectivity method, and analyzed with a 3-layer model. The density of a layer in contact with the first film containing the Ag alloy at this step is 2 $g/cm^3$ or more. Then, in this case, the second film inhibits penetration of hydrogen sulfide or moisture therethrough, and exhibits a very high effect as a protective film. Therefore, when the second film includes a $SiO_2$, layer, the density of the $SiO_2$ layer is measured with the X-ray reflectivity method, and analyzed with a 3-layer model, the density of a layer in contact with the first film including the Ag alloy of the three layers at this step is desirably 2 $g/cm^3$ or more. Incidentally, the reason why the Si oxide layer in contact with the Ag alloy is densified is not apparent. However, when the composition of the Ag—Bi—Ge alloy film is analyzed from the surface of the film in the direction of depth thereof with XPS (X-ray photoelectron spectroscopy), Ge has been concentrated to the surface of the Ag—Bi—Ge alloy film. This concentration conceivably contributes to densification of the second film, and reduction of pin holes. For example, for an Ag—Bi—Ge alloy film having a mean composition of Ge in the film of 0.1 atomic percent (the Ge composition in the film was determined by dissolving the film in a nitric acid solution, and analyzing the solution with ICP (optical emission spectroscopic analysis device)), with the XPS analysis, the compositions of Ge is 2.0 atomic percent at the outermost surface, 0.8 atomic percent at a depth of 0.7 nm from the surface, and a composition of detection limit or lower at a depth of 1.4 nm or more from the surface. The Ge composition at the outermost surface has been concentrated to as much as 20 times the mean composition in the film. On the other hand, also for a binary alloy film of Ag—Ge, the surface concentration of Ge is observed. However, the mean composition of Ge in the film is 0.1 atomic percent, which is the same composition as that of the Ag—Bi—Ge alloy film. However, the Ge composition at the surface is 1.0 atomic percent, indicating a lower degree of concentration than with the Bi-added alloy. Thus, addition with Bi in combination results in a further enhanced concentration of Ge at the Ag alloy surface. This increases the nucleus formation density of the Si oxide film, which conceivably contributes to the densification of the film and reduction of pin holes. In other words, Ge is an element in the same group as that of Si in the Periodic Table. For this reason, Si and Ge tend to bond to each other. Therefore, When Ge is present in a large amount on the Ag alloy film surface, Ge becomes a nucleus formation site of a Si oxide, resulting in an increase in nucleus formation density. Accordingly, conceivably, densification of the Si oxide and reduction of pin holes occur.

The Ag alloy of the first film desirably further contains one or more of Au, Pt, Pd, and Rh in a total content of 0.1 to 5 atomic percent. This is due to the following reason. Addition of one or more of Au, Pt, Pd, and Rh can further inhibit the occurrence of agglomeration due to halogen ions even when pin holes have been formed in the second film due to, for example, deposition of dust thereon. When the total content of these elements is less than 0.1 atomic percent, the effect of inhibiting agglomeration due to halogen ions is small. When the total content exceeds 5 atomic percent, not only the material cost of the Ag alloy film increases, but also the initial reflectivity tends to be reduced, and the sulfidation resistance tends to be reduced (pin holes of the second film tends to increase). Therefore, the total content of these elements is desirably set at 0.1 to 5 atomic percent. The total content of these elements is more preferably 0.3 to 3 atomic percent.

In the reflection film laminate in accordance with the present invention, in order to more enhance the durability, it is desirable that a plasma polymerization film is stacked on the second film (Si oxide). The thickness of the plasma polymerization film is preferably 10 to 1000 nm. In this case, the plasma polymerization film is preferably the one formed using organic silicon as a raw material. Examples of the organic silicon may include hexamethyl disiloxane, hexamethyl disilazane, and triethoxysilane. The plasma polymerization film formed using the organic silicon as a raw material is very inferior in wettability with water, and hence can prevent the penetration of moisture or halogen ions. Further, the plasma polymerization film is excellent in acid resistance and alkali resistance. For this reason, the plasma polymerization film produces an effect of holding the characteristics of the reflection film laminate either under an oxidizing atmosphere, or an alkaline atmosphere.

In the reflection film laminate in accordance with the present invention, the film thickness of the second film (Si oxide) is preferably 5 to 80 nm. The reasons for this will be described below. When the film thickness of the second film is less than 5 nm, the number of pin holes is too large, which makes it difficult to stop sulfidation. From this viewpoint, the film thickness of the second film is preferably 5 nm or more. The more preferable film thickness is 7 nm or more, and further preferably 10 nm or more. On the other hand, when the film thickness of the second film exceeds 80 nm, the film stress increases, which may cause cracking or peeling in the heat resistance test. Further, the $SiO_2$ layer is visually colorless and transparent, but absorbs light though in a little quantity. For this reason, when the film thickness exceeds 80 nm, the reflectivity is lower than 93%. Thus, the advantage of the high reflectivity of the Ag alloy undesirably becomes unable to be used. From these points, the film thickness of the second film is preferably 80 nm or less. The further preferable film thickness is 60 nm or less, and more preferably 50 nm or less. From the points described up to this point, the film thickness of the second film is preferably 5 to 80 nm.

The material commonly used as the reflection film material is Al, and the reflectivity thereof is about 85%. In contrast, the reflectivity of the reflection film laminate in accordance with the present invention is high. It can be configured such that the visible light reflectivity measured with a light within the wavelength range of 380 to 780 nm from a D65 light source according to JIS R3106 is 93% or more. Such a reflection film can provide equivalent brightness even when the consumption power of the light source (lamp) is reduced than in the related art. When a plurality of light sources are used, the number of light sources can be reduced. This can reduce the cost required for the light sources. Further, the reflection film can be preferably used as a reflector of a LED light source which was not capable of ensuring sufficient brightness with a conventional reflection film material.

In the reflection film laminate in accordance with the present invention, as the substrate, the one including glass, a resin, or the like can be used. These may be selected and used according to the temperature of heat generated by a light source. For example, there may be used the one including glass when the temperature is about 180° C. or more; the one including a polyester material such as a PET material or a PBT material for 120 to 180° C.; and the one including a polycarbonate material for 120° C. or less. Further, it is recommended that the Ag alloy of the first layer of the reflection film laminate in accordance with the present invention is deposited using a sputtering process using an Ag alloy sputtering target. Particularly, deposition is preferably performed by a DC sputtering process using a direct-current cathode.

When the reflection film laminate in accordance with the present invention is forded, the reflectivity of the Ag alloy film may be reduced during use due to dust or dirt on the substrate surface. For example, in the case where dirt or fine dust containing halogen ions or a sulfur component is attached on the substrate surface, when the Ag alloy film is formed on the substrate as it is, agglomeration of Ag occurs at the dust portion. Accordingly, the agglomeration reaches the Ag alloy film surface with an elapse of time. In due time, the reflectivity may be reduced. In order to improve the stability of such an adhesion, and to prevent Ag agglomeration due to dust on the substrate surface, it is preferable to put an underlayer film at the interface between the substrate and the Ag reflection film (the first layer including an Ag alloy).

As the underlayer film, there can be used a film including an elemental metal such as Cu, Ni, Co, W, Mo, Ta, Cr, or Ti, or an alloy of one or more thereof, a metal oxide film of Si, Ti, Al, Sn, Zn, or the like, a plasma polymerization film using organic silicon or the like as a raw material, a glass film of borosilicate glass or the like, a resin (acrylic resin, silicon resin, or the like) film including a coating film, or the like.

The film thickness of the underlayer film is preferably 5 nm or more. When the film thickness is less than 5 nm, a continuous film may not be formed. Therefore, when halogen ions and a sulfur component are deposited on the substrate, these and Ag become unable to be separated from each other. The more preferable film thickness is 7 nm or more.

On the other hand, the upper limit of the film thickness of the underlayer film varies according to the material. When the underlayer film is a metal film or a plasma polymerization film, the film thickness is preferably 500 nm or less. When the film thickness exceeds 500 nm, the film stress increases. Thus, when the heat resistance test and the moisture resistance test are carried out after depositing the laminate, cracking or peeling may occur. The more preferable film thickness is 400 nm or less, and further preferably 300 nm or less.

When the underlayer film is a metal oxide film, the film thickness is preferably 100 nm or less. When the film thickness exceeds 100 nm, the film stress increases. Thus, when the heat resistance test and the moisture resistance test are carried out after depositing the laminate, cracking or peeling may occur. The more preferable film thickness is 90 nm or less, and further preferably 80 nm or less.

When the underlayer film is a resin film such as a coating film, the upper limit of the film thickness cannot be particularly determined. However, it is preferably 200 μm or less in terms of the process.

The vehicular lighting fixtures in accordance with the present invention denote a headlamp and a rear lamp of a car or a motorcycle. The reflection film laminate of the present invention is used for a reflector or an extension of these lamps.

The illuminating instruments in accordance with the present invention denote a downlight and a fluorescent lamp. The laminate of the present invention is used for the reflectors thereof. The optical mirror or the like in accordance with the present invention denotes a mirror in an analyzer using reflection of light. The laminates of the present invention is used for the reflectors thereof. The LED's in accordance with the present invention denote LED's of shell type, flat type, chip type, and other types. The reflection film laminate of the present invention is used for the reflection electrode thereof. The organic EL displays in accordance with the present invention denote displays for television sets or cellular phones using organic EL. The reflection film laminates of the present invention is used for the reflectors thereof. The organic EL illuminating instruments in accordance with the present invention denote the illuminating instruments using organic EL, and the reflection film laminates of the present invention are used for the reflectors thereof.

The Ag alloy of the first film in accordance with the present invention contains, as components, Bi and A (one or more of V, Ge, and Zn). In addition, the Ag alloy preferably further contains one or more of Au, Pt, Pd, and Rh. In this case, if required, the Ag alloy may contain an element other than the foregoing elements. Therefore, the Ag alloy of the first film may contain only the foregoing elements, or may contain the foregoing elements and other elements than the foregoing elements.

When the Ag alloy contains only the foregoing elements, the reflection film laminate in accordance with the present invention can be expressed as: "a reflection film laminate characterized by including: a first film including an Ag alloy containing Bi in an amount of 0.02 atomic percent or more, and further containing one or more of V, Ge, and Zn in a total content of 0.02 atomic percent or more, the balance including inevitable impurities and Ag, and satisfying the expression (1) $[7\times[A]+13\times[Bi]\leq 8]$ where [A] (atomic percent) denotes the content of one or more of the V, Ge, and Zn, and [Bi] (atomic percent) denotes the content of Bi, formed on a substrate; and a second film including an oxide of Si, formed thereon", "a reflection film laminate characterized by including: a first film including an Ag alloy containing Bi in an amount of 0.02 atomic percent or more, and further containing one or more of V, Ge, and Zn in a total content of 0.02 atomic percent or more, the balance including inevitable impurities and Ag, the Ag alloy satisfying the expression (1) $[7\times[A]+13\times[Bi]\leq 8]$ where [A] (atomic percent) denotes the content of one or more of the V, Ge, and Zn, and [Bi] (atomic percent) denotes the content of Bi, formed on a substrate; and a second film including an oxide of Si, formed thereon"; or the like. In this case, the reflection film laminate in accordance with the present invention can also be expressed as: "a reflection film laminate characterized by including: a first film including an Ag alloy containing Bi in an amount of 0.02 atomic percent or more, further containing one or more of V, Ge, and Zn in a total content of 0.02 atomic percent or more, and further contains one or more of Au, Pt, and Rh in a total content of 0.1 to 5 atomic percent, the balance including inevitable impurities and Ag, and satisfying the expression (1) $[7\times[A]+13\times[Bi]\leq 8]$ where [A] (atomic percent) denotes the content of one or more of the V, Ge, and Zn, and [Bi] (atomic percent) denotes the content of Bi, formed on a substrate; and a second film including an oxide of Si, formed thereon", "a reflection film laminate characterized by including: a first film including an Ag alloy containing Bi in an amount of 0.02 atomic percent or more, further containing one or more of V, Ge, and Zn in a total content of 0.02 atomic percent or more, and further containing one or more of Au, Pt, and Rh in a total content of 0.1 to 5 atomic percent, the balance including inevitable impurities and Ag, the Ag alloy satisfying the expression (1) $[7\times[A]+13\times[Bi]\leq 8]$ where [A] (atomic percent) denotes the content of one or more of the V, Ge, and Zn, and [Bi] (atomic percent) denotes the content of Bi, formed on a substrate; and a second film including an oxide of Si, formed thereon"; or the like."

Examples

Embodiments 4 to 7

Examples and Comparative Examples in accordance with a second invention of the present invention will be described below. Incidentally, the second invention is not limited to the Examples, and can be carried out with proper changes added thereto within the scope adaptable to the gist of the present invention. All of these are included in the technical range of the present invention.

Embodiment 4

In a chamber of a sputtering apparatus as shown in FIG. 1, a pure Ag or Ag—Bi alloy target (a target including pure Ag or a target including an Ag—Bi alloy) with a diameter of 100 mm and a thickness of 5 mm was set. A PC substrate (substrate including polycarbonate) with a diameter of 50 mm and a thickness of 1 mm was set so as to face the target. Thus, vacuum evacuation was carried out so that the pressure inside the chamber was $1\times10^{-5}$ Torr or less. Thereafter, an Ar gas was introduced into the chamber, so that the pressure in the chamber was $2\times10^{-3}$ Torr. Thus, the target was applied with DC (direct current) to generate a plasma. As a result, the target was sputtered with a DC power of 200 W, thereby to deposit a pure Ag thin film or an Ag alloy thin film (first film) on the PC substrate. At this step, as the target, a pure Ag target was used for deposition of a pure Ag thin film. In the case of deposition of an Ag alloy thin film not containing Bi, deposition was carried out using the one including a metal chip of the alloy element put on a pure Ag target. In the case of an Ag alloy thin film including Bi and other elements than Bi, deposition was carried out using the one including a metal chip of an element other than Bi put on an Ag—Bi alloy target. Incidentally, the distance between the target and the PC substrate was set at 80 mm. Thus, deposition was carried out while revolving the PC substrate. The mean contents of various additive elements in the Ag alloy film thus deposited were measured with an ICP (Inductivity Coupled Plasma) optical emission mass spectrometry. Namely, using an acid capable of dissolving both Ag and the additive elements, the Ag alloy film was dissolved. Then, the ratios of Ag and the additive elements in the resulting solution were measured with the ICP optical emission mass spectrometry, and the values were normalized to 100% to be taken as the composition of the Ag alloy film. Incidentally, the composition was determined in terms of atomic percent.

Then, the target was exchanged with a $SiO_2$ target (target including $SiO_2$), and vacuum evacuation was carried out so that the pressure inside the chamber was $1\times10^{-5}$ Torr or less.

Thereafter, an Ar gas was introduced into the chamber, so that the pressure in the chamber was $2 \times 10^{-3}$ Torr. Thus, the target was applied with RF (radio frequency) current to generate a plasma. As a result, the target was sputtered with a RF power of 200 W, thereby to deposit a $SiO_2$ film (second film) on the first film (pure Ag thin film or Ag alloy thin film), resulting in a reflection film laminate. Incidentally, the distance between the target and the PC substrate was set at 80 mm. Thus, the Si oxide film was deposited while revolving the PC substrate.

The component composition, the value of $[7 \times [A] + 13 \times [Bi]]$, and the film thickness of the first film, and the film thickness of the second film ($SiO_2$ film) in the reflection film laminate thus obtained are shown in Table 3. As for these reflection film laminates, each visible light reflectivity (initial reflectivity) was measured by a light within the wavelength range of 380 to 780 nm from a D65 light source according to JIS R3106. Then, the sulfidation resistance test (sulfidation resistance test (2)), the heat resistance test (heat resistance test (3)), the saltwater resistance test, and the moisture resistance test held under the following conditions were carried out.

[Sulfidation Resistance Test (2)]
Test solution composition: 10 mass % ammonium sulfide aqueous solution;
Exposure position: set so that the deposited surface faces the liquid surface at a height of 3 cm from the liquid surface of the test solution; and
Exposure time: 20 minutes

[Heat Resistance Test (3)]
Test temperature: 130° C.;
Test atmosphere: air
and
Test time: 1000 hours

[Salt Water Resistance Test]
Test solution composition: 3 wt % NaCl aqueous solution; and
Testing method: 10-minute immersion in the NaCl aqueous solution

[Moisture Resistance Test]
240-hour holding in a thermo-hygrostatic test device at a temperature of 50° C. and a humidity of 95 RH %

As for the reflection film laminate after the sulfidation resistance test, the surface (the surface on the side exposed in the sulfidation resistance test) was enlarged to 200 times by an optical microscope, and a photograph of the surface was taken. Then, the number of spot-like discolored sites occurred in a 0.2 mm×0.2 mm region in terms of dimensions of the photograph of a micrometer taken at the same magnification (i.e., a 0.2 mm×0.2 mm region in terms of actual dimensions), namely, the number of sulfidation spots of Ag occurred at pin hole sites of the Si oxide film was counted. Thus, the sulfidation resistance (degree of resistance to sulfidation) was evaluated based on the number of spots of occurrence. The number of spots of occurrence of 0 (zero) was rated as ⊚; 1 to 3, as ○; 4 to 6, as Δ; and 7 or more, as x. Whereas, for the reflection film laminate after the sulfur test, with the same method as with the measurement of the initial reflectivity, the visible light reflectivity for a light within the wavelength range of 380 to 780 nm was measured. Thus, the difference from the initial reflectivity [i.e., difference in reflectivity between before and after the test=initial reflectivity (%)–reflectivity (%) after heat resistance test] was determined. Thus, the sulfidation resistance (i.e., the degree of density of the Si oxide film) was also evaluated based on the difference in reflectivity. The one with the difference in reflectivity of 0.5% or less was rated as ⊚; more than 0.5% and 1% or less, as ○; more than 1% and 3% or less, as Δ; and more than 3%, as x.

As for the reflection film laminate after the heat resistance test, with the same method as with the measurement of the reflectivity of the sulfidation resistance test, the visible light reflectivity for a light within the wavelength range of 380 to 780 nm was measured. Thus, the difference from the initial reflectivity [i.e., difference in reflectivity between before and after the test=initial reflectivity (%)–reflectivity (%) after heat resistance test] was determined. Thus, the heat resistance (i.e., the degree of density of the Si oxide film and the degree of resistance to Ag agglomeration) was evaluated based on the difference in reflectivity. The one with the difference in reflectivity of 0.5% or less was rated as ⊚; more than 0.5% and 1% or less, as ○; more than 1 and 3% or less, as Δ; and more than 3%, as x.

Whereas, for the reflection film laminate after the salt water resistance test, with the same method as with the measurement of the reflectivity of the sulfidation resistance test, the visible light reflectivity for a light within the wavelength range of 380 to 780 nm was measured. Thus, the difference from the initial reflectivity [i.e., difference in reflectivity between before and after the test=initial reflectivity (%)–reflectivity (%) after heat resistance test] was determined. Thus, the salt water resistance (i.e., the degree of pinholes of the Si oxide film and the halogen resistance of the Ag alloy film) was evaluated based on the difference in reflectivity. The one with the difference in reflectivity of 0.5% or less was rated as ⊚; more than 0.5% and 1% or less, as ○; more than 1% and 3% or less, as Δ; and more than 3%, as x.

As for the moisture resistance test, the number of white spots occurred on the surface of the reflection film laminate after the test was visually measured. The number of spots of occurrence of white spots of 0 (zero) is rated as ⊚; 1 to 4, as ○; 5 to 9, as Δ; and 10 or more, as x.

The laminates rated only as ⊚ or ○ in all the evaluations up to this point were determined as acceptable; and those rated as Δ or x in even at least one evaluation was determined as unacceptable.

The results of the sulfidation resistance test (2) (the evaluation results of the sulfidation resistance), the results of the heat resistance test (3) (evaluation results of the heat resistance), and the results of the salt water resistance test and the results of the moisture resistance test are shown in Table 3.

As indicated from Table 3, for No. 23 (Comparative Example), the first film includes Ag. Accordingly, the sample underwent no densification of the Si oxide film nor reduction of pin holes, and the Ag film itself has no durability. Therefore, the sample was rated as unacceptable in all the tests. For Nos. 24 and 25 (Comparative Examples), the first film includes an Ag alloy, but the Ag alloy contains only Bi. Accordingly, each sample underwent no densification of the Si oxide film nor reduction of pin holes. Each sample showed favorable characteristics in salt water resistance and moisture resistance owing to the durability of the Ag—Bi alloy film itself, but was rated as unacceptable in sulfidation resistance and heat resistance. For Nos. 36 and 38 (Comparative Examples), the first film includes an Ag alloy, and the Ag alloy contains only A. Accordingly, this also underwent insufficient densification of the Si oxide film and reduction of pin holes, and was rated as unacceptable in terms of sulfidation resistance and heat resistance. For Nos. 39 and 40, and 43 to 45 (Comparative Examples), other alloy elements than A have been added to Ag—Bi. However, each sample also underwent insufficient densification of the Si oxide film and reduction of pin holes, and was rated as unacceptable in terms of sulfidation resistance and heat resistance. For No. 37, the value of $[7 \times [A] + 13 \times [Bi]]$ exceeds 8, and hence the initial reflectivity was less than 93%. Further, because of the low Bi content, the sample was not only bad in the salt water resistance and the moisture resistance, but also insufficient in densification of the Si oxide film and reduction of pin holes. Thus, the sample was rated as unacceptable in terms of sulfidation resistance and heat resistance. For No. 41, the Si oxide film is too thin, so that pin holes cannot be eliminated. Thus, the sample was rated as unacceptable in terms of sulfidation resistance. For No. 42, Au has been added excessively, which contrarily results in an increase in pin holes of the Si oxide film. Thus, the sample was rated as unacceptable.

For Nos. 26 to 35 (Examples of the present invention), the initial reflectivities were as favorable as 93% or more. Thus, the samples were rated as ⊚ or ○ in all the evaluations, and showed excellent characteristics.

Embodiment 5

Figure 3:
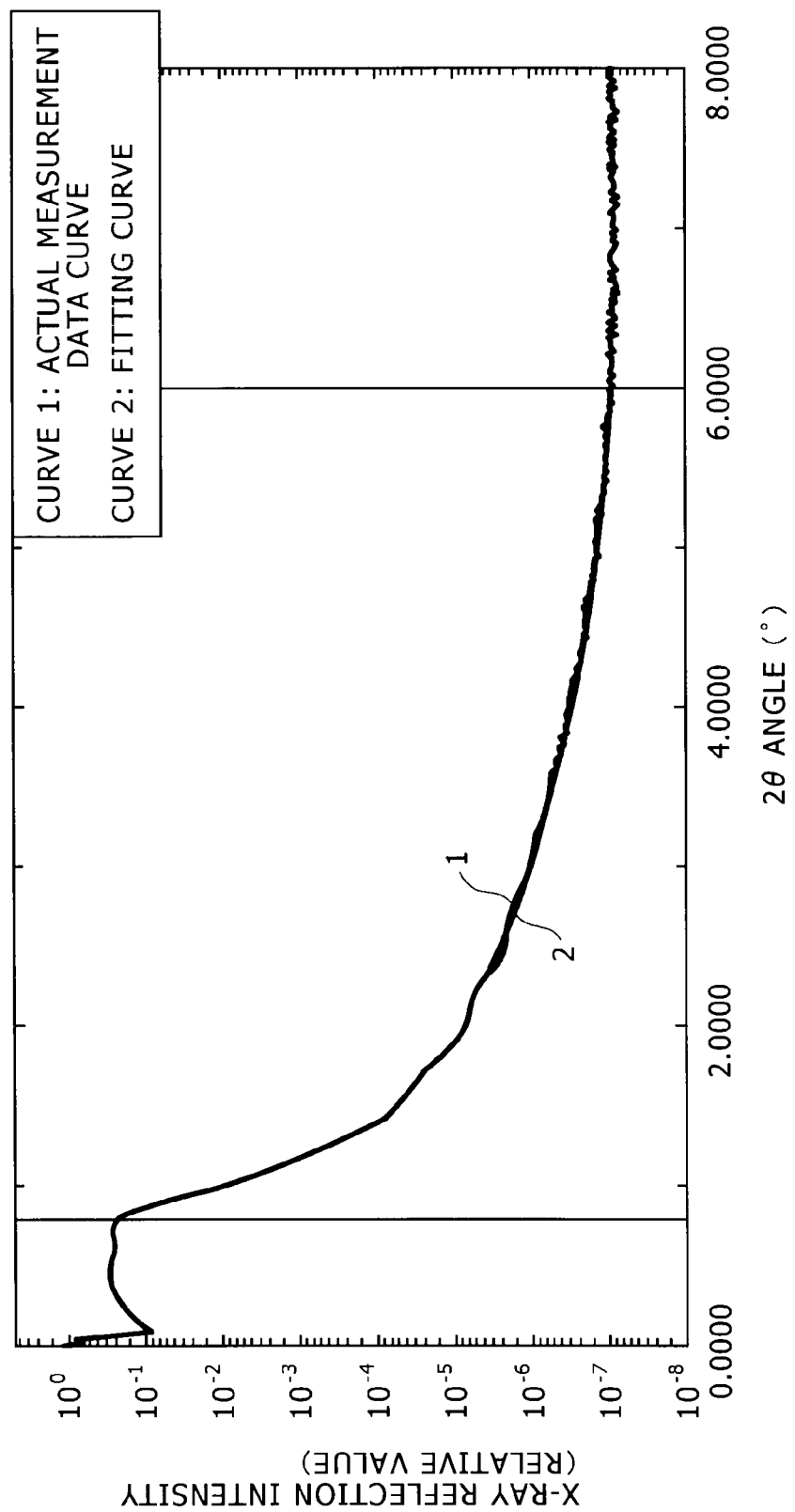
FIG. 3 A view showing analysis results when the $SiO_2$ film in accordance with Embodiment 5 has been analyzed with a 3-layer model.

Using the samples of Nos. 24, 26, and 33 of Table 3, the density of each Si oxide film was measured with the X-ray reflectivity method. The measurement was carried out under the following conditions, thereby to analyze the density of each $SiO_2$ film. Below, examples of the analysis will be shown. When the sample of No. 26 is used, the results of analysis of the $SiO_2$ film with a one-layer model are shown in FIG. 2. In this case, a difference is observed between the curve of actual measurement data and a fitting curve by simulation. The difference is particularly noticeable when 2θ is between 1 to 3°. With this one-layer model, the precise value of the $SiO_2$ film density cannot be obtained. On the other hand, the results of analysis of the $SiO_2$ film with a 3-layer model are shown in FIG. 3. In this case, it has been shown that the curve of the actual measurement data and the fitting curve by simulation are in good agreement with each other. Alternatively, a multilayer model of four or more layers also similarly provided a good correlation therebetween. However, the present inventors found that a 3-layer model can provide sufficient correlation, and hence they determined to carry out analysis with a 3-layer model. Thus, the density of the $SiO_2$ film was analyzed with a model for carrying out analysis in a manner divided into three layers (the outermost layer, the intermediate layer, and the layer in contact with the first film including the Ag alloy). As a result, for the sample Nos. 26 and 33 showing favorable sulfidation resistance and heat resistance, the densities of the respective layers each in contact with the first layer including the Ag alloy were found to be 2.4 g/cm³ and 2.7 g/cm³, respectively. Thus, both are 2 g/cm³ or more. In contrast, the sample No. 24 inferior in performances was found to have a value as low as 1.8 g/cm³.

[X-ray Reflectivity Method Measuring Conditions]
Measuring apparatus: X-ray diffraction apparatus;
Measuring conditions: tube voltage 45 kV, tube current 200 mA;
Measuring method: thin film X-ray diffraction method (parallel beam/X-ray reflectivity measurement);
2θ scan range: 0 to 8.0°, step distance: 0.01°; and
Scan speed: 0.2°/min
[Analysis Method]
X-ray reflectivity analysis software (CXSS Version 2.1.3.0: manufactured by Rigaku Co., Ltd.) is used.

Embodiment 6

With the same method as with the embodiment 4, on a PC substrate, Ag alloy thin films (first films) having the same compositions as those of Nos. 28, 31, and 35 of Table 3 were deposited with a film thickness of 150 nm. On each first film, a Si oxide film (second film) was deposited with a film thickness of 10 nm, resulting in a reflection film laminate (2-layer laminate type).

Figure 4:
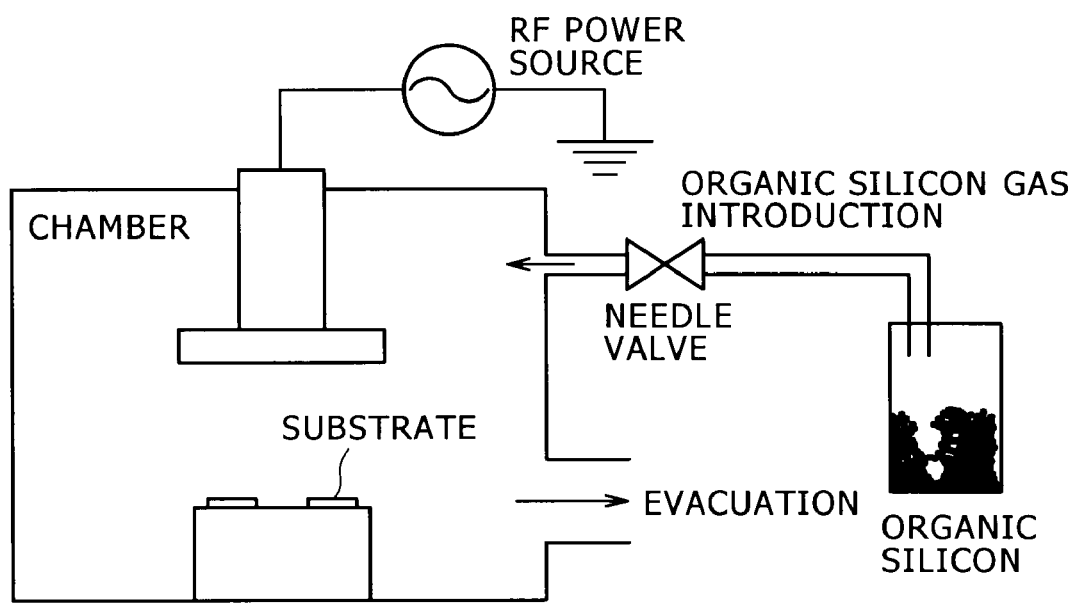
FIG. 4 A schematic view showing a plasma CVD apparatus used for manufacturing (deposition) of a reflection film laminate in accordance with Embodiment 6.

Some of the reflection film laminates (2-layer laminate type) were each set in a chamber of a plasma CVD apparatus as shown in FIG. 4. Vacuum evacuation was carried out so that the inside pressure of the chamber was $1\times10^{-5}$ Torr or less. Then, a needle valve between the bubbler and the chamber in the apparatus was opened to introduce a vapor of organic silicon in the bubbler into the chamber. Thus, by adjusting the opening/closing degree of the needle valve, the pressure inside the chamber was set at 0.1 Torr. Then, the upper electrode in the chamber was applied with RF, thereby to generate a plasma with a 200-W power. Thus, a plasma polymerization film with a thickness of 20 nm was formed on the substrate (the 2-layer laminate), resulting in a reflection film laminate (3-layer laminate type). Incidentally, as the organic silicon, hexamethyl disiloxane was used.

For the 3-layer laminate type reflection film laminates thus obtained, and the 2-layer laminate type reflection film laminates, the acid resistance test and the alkali resistance test were carried out. The acid resistance test was carried out in the following manner. The reflection film laminate was immersed in a 25° C. 1 mass % sulfuric acid aqueous solution for 20 minutes. The alkali resistance test was carried out in the following manner. The reflection film laminate was immersed in a 25° C. 1 mass % potassium hydroxide aqueous solution for 20 minutes.

The cross section of each reflection film laminate after the acid resistance test and the alkali resistance test was observed by a scanning electron microscope. This indicates as follows. For the reflection film laminate of the 2-layer laminate type, either in a sulfuric acid aqueous solution or in a potassium hydroxide aqueous solution, the Si oxide film (second film) dissolves, resulting in a 1-layer structure of only the Ag alloy layer. On the other hand, for the reflection film laminate of the 3-layer laminate type, the 3-layer structure is kept both after the acid resistance test and after the alkali resistance test. Accordingly, it could be confirmed that the acid resistance and the alkali resistance are remarkably improved by lamination of the plasma polymerization film.

Embodiment 7

In each of the reflection film laminates of the sample Nos. 27 and 29 rated as "○" indicative of occurrence of 1 to 4 white spots in the moisture resistance test in the embodiment 4, an underlayer film of a metal or a metal oxide was added between the substrate and the first film of the Ag alloy, thereby to manufacture a 3-layer reflection film laminate. Incidentally, the formation of the metal or metal oxide underlayer film was accomplished by the sputtering process shown in the embodiment 4. A Ag alloy film and a Si oxide film were continuously deposited thereon. These reflection film laminates were subjected to the heat resistance test (3) and the moisture resistance test. The film structures and the results of the heat resistance test (3) and the moisture resistance test are shown in Table 4.

Table 4 indicates as follows. For Nos. 46 to 50, while keeping high durability in heat resistance, the improvement of the moisture resistance was observed owing to the underlayer film. Thus, the durability was improved by the underlayer film. Whereas, for Nos. 51 to 53, the improvements of the heat resistance and the moisture resistance were observed. It can be considered that slight dirt on the substrate surface was separated from Ag by the underlayer film to inhibit agglomeration of Ag.

TABLE 3

| No. | Ag alloy (first film) composition (atomic percent) | 7 × [A] + 13 × [Bi] | Second film composition | First film thickness (nm) | Second film thickness (nm) | Initial reflectivity (%) |
|---|---|---|---|---|---|---|
| 23 | Ag | 0 | SiO$_2$ | 100 | 10 | 96.8 |
| 24 | Ag—0.1Bi | 1.3 | SiO$_2$ | 150 | 10 | 95.8 |
| 25 | Ag—0.05Bi | 0.65 | SiO$_2$ | 100 | 10 | 96.3 |
| 26 | Ag—0.1Bi—0.1Ge | 2 | SiO$_2$ | 150 | 10 | 95.6 |
| 27 | Ag—0.05Bi—0.1Ge | 1.35 | SiO$_2$ | 100 | 10 | 95.9 |
| 28 | Ag—0.05Bi—0.05Ge | 1 | SiO$_2$ | 150 | 15 | 96.0 |
| 29 | Ag—0.03Bi—0.03Ge | 0.6 | SiO$_2$ | 200 | 12 | 96.3 |
| 30 | Ag—0.2Bi—0.2V | 4 | SiO$_2$ | 200 | 8 | 95.0 |
| 31 | Ag—0.1Bi—0.5Zn | 4.8 | SiO$_2$ | 150 | 10 | 94.8 |
| 32 | Ag—0.05Bi—0.5Zn | 7.7 | SiO$_2$ | 150 | 12 | 93.8 |
| 33 | Ag—0.05Bi—0.2Ge—0.5Au | 2.05 | SiO$_2$ | 150 | 12 | 95.1 |
| 34 | Ag—0.05Bi—0.5Zn—0.6Au | 4.8 | SiO$_2$ | 150 | 10 | 94.5 |
| 35 | Ag—0.1Bi—0.2V—0.7Au | 2.7 | SiO$_2$ | 300 | 15 | 95.2 |
| 36 | Ag—0.1Ge | 0.7 | SiO$_2$ | 100 | 10 | 96.5 |
| 37 | Ag—0.01Bi—1.2Ge | 8.53 | SiO$_2$ | 150 | 10 | 92.7 |
| 38 | Ag—1Zn | 7 | SiO$_2$ | 150 | 10 | 93.5 |
| 39 | Ag—0.1Bi—0.2Nd | — | SiO$_2$ | 150 | 10 | 95.1 |
| 40 | Ag—0.1Bi—0.5Au | — | SiO$_2$ | 150 | 10 | 95.2 |
| 41 | Ag—0.05Bi—0.05Ge | 1 | SiO$_2$ | 150 | 3 | 96.1 |
| 42 | Ag—0.1Bi—0.1Zn—6Au | 2 | SiO$_2$ | 150 | 12 | 95.1 |
| 43 | Ag—0.1Bi—0.4Ti | — | SiO$_2$ | 150 | 15 | 94.2 |
| 44 | Ag—0.1Bi—0.7Ta | — | SiO$_2$ | 150 | 12 | 88.3 |
| 45 | Ag—0.1Bi—0.5Fe | — | SiO$_2$ | 150 | 12 | 93.2 |

| No. | Sulfidation resistance test (2) results | | Heat resistance test (3) results | Salt water resistance | Moisture resistance | Remarks |
|---|---|---|---|---|---|---|
| | Sulfidation spot | Change in reflectivity | | | | |
| 23 | X | △ | X | X | X | Comparative example |
| 24 | X | X | △ | ◎ | ◎ | Comparative example |
| 25 | X | X | △ | ◎ | ○ | Comparative example |
| 26 | ◎ | ◎ | ◎ | ◎ | ◎ | Example |
| 27 | ◎ | ◎ | ◎ | ◎ | ○ | Example |
| 28 | ○ | ◎ | ◎ | ◎ | ◎ | Example |
| 29 | ○ | ◎ | ○ | ○ | ○ | Example |
| 30 | ◎ | ◎ | ◎ | ◎ | ◎ | Example |
| 31 | ○ | ◎ | ◎ | ◎ | ◎ | Example |
| 32 | ○ | ◎ | ◎ | ◎ | ○ | Example |
| 33 | ◎ | ◎ | ◎ | ◎ | ◎ | Example |
| 34 | ○ | ◎ | ◎ | ◎ | ◎ | Example |
| 35 | ◎ | ◎ | ◎ | ◎ | ◎ | Example |
| 36 | △ | △ | ◎ | △ | △ | Comparative example |
| 37 | △ | △ | ◎ | △ | △ | Comparative example |
| 38 | X | △ | △ | X | X | Comparative example |
| 39 | △ | X | ○ | ○ | ○ | Comparative example |
| 40 | X | X | △ | ◎ | ◎ | Comparative example |
| 41 | X | △ | △ | ◎ | ◎ | Comparative example |
| 42 | X | ○ | ○ | ◎ | ◎ | Comparative example |
| 43 | △ | △ | X | △ | X | Comparative example |
| 44 | X | △ | X | ○ | X | Comparative example |
| 45 | X | △ | △ | X | X | Comparative example |

TABLE 4

| No. | Ag alloy (first film) composition (atomic percent) | Underlayer film composition | Second film composition | Underlayer film thickness (nm) | First film thickness (nm) | Second film thickness (nm) | Initial reflectivity (%) | Heat resistance test (3) results | Moisture resistance | Remarks |
|---|---|---|---|---|---|---|---|---|---|---|
| 46 | Ag—0.05Bi—0.1Ge | Ti | SiO$_2$ | 50 | 100 | 10 | 95.5 | ◎ | ◎ | Example |
| 47 | Ag—0.05Bi—0.1Ge | Cr | SiO$_2$ | 50 | 100 | 10 | 95.6 | ◎ | ◎ | Example |
| 48 | Ag—0.05Bi—0.1Ge | SiO$_2$ | SiO$_2$ | 50 | 100 | 10 | 95.8 | ◎ | ◎ | Example |
| 49 | Ag—0.05Bi—0.1Ge | Al$_2$O$_3$ | SiO$_2$ | 50 | 100 | 10 | 95.9 | ◎ | ◎ | Example |
| 50 | Ag—0.05Bi—0.1Ge | Plasma polymerization film | SiO$_2$ | 50 | 100 | 10 | 95.7 | ◎ | ◎ | Example |
| 51 | Ag—0.03Bi—0.03Ge | Ti | SiO$_2$ | 50 | 200 | 12 | 95.8 | ◎ | ◎ | Example |
| 52 | Ag—0.03Bi—0.03Ge | SiO$_2$ | SiO$_2$ | 50 | 200 | 12 | 96.1 | ◎ | ◎ | Example |
| 53 | Ag—0.03Bi—0.03Ge | Plasma polymerization film | SiO$_2$ | 50 | 200 | 12 | 96.0 | ◎ | ◎ | Example |

INDUSTRIAL APPLICABILITY

For the reflection film and the reflection film laminate in accordance with the present invention, agglomeration and sulfidation of the Ag alloy film due to heat are less likely to occur, and hence the high reflectivity is kept for a long period. For this reason, the present invention can be preferably used in a LED, an organic EL display, an organic EL illuminating instrument, a vehicular lighting fixture, a reflector for an illumination instrument, or the like. This can usefully improve the durability.

As described up to this point, the present invention was described in details and by reference to specific embodiments. However, it will be obvious to those skilled in the art that various changes and modifications may be added without departing from the spirit and scope of the present invention. The present application is based on Japanese patent application (JP-B No. 2007-247356) filed on Sep. 25, 2007, Japanese patent application (JP-B No. 2007-262454) filed on Oct. 5, 2007, and Japanese patent application (JP-B No. 2008-168977) filed on Jun. 27, 2008, the contents of which are hereby incorporated by reference.

The invention claimed is:

1. A reflection film formed on a substrate, said reflection film being formed of an Ag alloy film comprising
    Ag as a main component,
    Bi in an amount of 0.02 atomic percent or more, and
    one or more of V, Ge, and Zn in a total content of 0.08 atomic percent or more, and
    further satisfying the following expression (1):

$$7\times[A]+13\times[Bi]\leq 8 \qquad (1)$$

where [A] (atomic percent) denotes the content of one or more of the V, Ge, and Zn, and [Bi] (atomic percent) denotes the content of Bi and wherein the reflection film has a visible light reflectivity of 93% or more as measured with a light within a wavelength range of 380 to 780 nm from a D65 light source according to JIS R3106.

2. The reflection film according to claim 1, wherein the reflection film comprises a layer having a higher content of one or more of V, Ge, and Zn than in the inside of the Ag alloy film, on the surface of the Ag alloy film.

3. The reflection film according to claim 2, wherein the layer having a higher content of one or more of V, Ge, and Zn comprises an oxide of one or more of V, Ge, and Zn.

4. The reflection film according to claim 1, wherein the Ag alloy film further comprises one or more of Au, Pt, Pd, and Rh in a total content of 0.1 to 5 atomic percent.

5. A vehicular lighting fixture comprising the reflection film according to claim 1.

6. An illuminating instrument comprising the reflection film according to claim 1.

7. A LED comprising the reflection film according to claim 1.

8. An organic EL display comprising the reflection film according to claim 1.

9. An organic EL illuminating instrument comprising the reflection film according to claim 1.

10. An optical mirror comprising the reflection film according to claim 1.

11. A reflection film laminate formed on a substrate, comprising:
    a first film comprising an Ag alloy film comprising
        Ag as a main component,
        Bi in an amount of 0.02 atomic percent or more, and
        one or more of V, Ge, and Zn in a total content of 0.08 atomic percent or more, and
        further satisfying the following expression (1):

$$7\times[A]+13\times[Bi]\leq 8 \qquad (1)$$

where [A] (atomic percent) denotes the content of one or more of the V, Ge, and Zn, and [Bi] (atomic percent) denotes the content of Bi; and
    a second film comprising an oxide of Si, formed on the first film and wherein the reflection film has a visible light reflectivity of 93% or more as measured with a light within a wavelength range of 380 to 780 nm from a D65 light source according to JIS R3106.

12. The reflection film laminate according to claim 11, wherein the reflection film laminate comprises a layer having a higher content of one or more of V, Ge, and Zn than in the inside of the Ag alloy film, at the interface between the first film comprising the Ag alloy film and the second film comprising an oxide of Si.

13. The reflection film laminate according to claim 12, wherein the layer having a higher content of one or more of V, Ge, and Zn comprises an oxide of one or more of V, Ge, and Zn.

14. The reflection film laminate according to claim 11, wherein the first film further comprises one or more of Au, Pt, Pd, and Rh in a total content of 0.1 to 5 atomic percent.

15. The reflection film laminate according to claim 11, wherein, when assuming that the second film comprising an oxide of Si is SiO$_2$, the density of the film is measured with an X-ray reflectivity method, and analyzed with a model divided into three layers, the density of the layer in contact with at least the first film comprising the Ag alloy film out of the three layers is 2 g/cm$^3$ or more.

16. The reflection film laminate according to claim 11, wherein the thickness of the second film is 5 to 80 nm.

17. The reflection film laminate according to claim 11, further comprising a plasma polymerization film formed on the second film.

18. The reflection film laminate according to claim 11, comprising a film including a metal film, a metal oxide film, a plasma polymerization film, or a resin film, formed as an underlayer film between the substrate and the first film.

19. A vehicular lighting fixture comprising the reflection film laminate according to claim 11.

20. An illuminating instrument comprising the reflection film laminate according to claim 11.

21. A LED comprising the reflection film laminate according to claim 11.

22. An organic EL display comprising the reflection film laminate according to claim 11.

23. An organic EL illuminating instrument comprising the reflection film laminate according to claim 11.

24. An optical mirror comprising the reflection film laminate according to claim 11.

25. The reflection film laminate according to claim 11, wherein the second film is formed directly on the first film.

* * * * *